(12) United States Patent
Sun et al.

(10) Patent No.: US 11,326,095 B2
(45) Date of Patent: May 10, 2022

(54) BARIUM TITANIUM PARTICLES, METHOD OF PREPARING THE SAME, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Xiaowei Sun, Shenzhen (CN); Kai Wang, Shenzhen (CN); Miao Zhou, Shenzhen (CN); Hongcheng Yang, Shenzhen (CN); Pai Liu, Shenzhen (CN); Bing Xu, Shenzhen (CN); Lixuan Chen, Shenzhen (CN); Dongze Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/050,410

(22) PCT Filed: Sep. 21, 2020

(86) PCT No.: PCT/CN2020/116455
§ 371 (c)(1),
(2) Date: Oct. 23, 2020

(87) PCT Pub. No.: WO2022/032811
PCT Pub. Date: Feb. 17, 2022

(65) Prior Publication Data
US 2022/0089939 A1 Mar. 24, 2022

(30) Foreign Application Priority Data
Aug. 13, 2020 (CN) .................. 202010809974.X

(51) Int. Cl.
*C09K 11/02* (2006.01)
*C01G 23/00* (2006.01)
(Continued)

(52) U.S. Cl.
CPC .......... *C09K 11/025* (2013.01); *C01G 23/006* (2013.01); *C09K 11/08* (2013.01);
(Continued)

(58) Field of Classification Search
CPC .................. C01G 23/006; G02F 1/133614
See application file for complete search history.

(56) References Cited

FOREIGN PATENT DOCUMENTS

| CN | 101961940 A | 2/2011 |
|---|---|---|
| CN | 111302390 A | 6/2020 |

(Continued)

*Primary Examiner* — C Melissa Koslow
(74) *Attorney, Agent, or Firm* — PV IP PC; Wei Te Chung; Ude Lu

(57) ABSTRACT

Barium titanium particles, a method of preparing the same, and a display panel are disclosed. The method includes steps of mixing a barium source precursor and a titanium source precursor with an alkaline solution to obtain a to-be-reacted mixture solution, wherein the barium source precursor is selected from barium enoate; and reacting the to-be-reacted mixture solution under a first condition for a first time, and then isolating and purifying to obtain the barium titanium particles.

14 Claims, 3 Drawing Sheets mixing a barium source precursor and a titanium source precursor with an alkaline solution, to obtain a to-be-reacted mixture solution, wherein the barium source precursor is selected from barium enoate ⟶ S01 reacting the to-be-reacted mixture solution under a first condition for a first time, and then isolating and purifying to obtain the barium titanium particles ⟶ S02

(51) Int. Cl.
  *C09K 11/08* (2006.01)
  *H01L 33/06* (2010.01)
  *B82Y 20/00* (2011.01)
  *B82Y 40/00* (2011.01)
  *G02F 1/1335* (2006.01)

(52) U.S. Cl.
  CPC ............... *B82Y 20/00* (2013.01); *B82Y 40/00* (2013.01); *C01P 2002/82* (2013.01); *C01P 2004/64* (2013.01); *G02F 1/133614* (2021.01); *H01L 33/06* (2013.01)

(56) References Cited

FOREIGN PATENT DOCUMENTS

| | | | |
|---|---|---|---|
| CN | 111363385 | * | 7/2020 |
| CN | 111363385 A | | 7/2020 |
| WO | 2014110602 A1 | | 7/2014 |

* cited by examiner wave number (cm$^{-1}$)

BARIUM TITANIUM PARTICLES, METHOD OF PREPARING THE SAME, AND DISPLAY PANEL

RELATED APPLICATIONS

This application is a National Phase of PCT Patent Application No. PCT/CN2020/116455 having international filing date of Sep. 21, 2020, which claims the benefit of priority of Chinese Patent Application No. 202010809974.X filed on Aug. 13, 2020. The contents of the above applications are all incorporated by reference as if fully set forth herein in their entirety.

FIELD OF INVENTION

The present application relates to the field of display technologies, and in particular to barium titanium particles and a display panel.

BACKGROUND OF INVENTION

Recently, quantum dots, used as popular display material, have been extensively studied and have made certain progress in the display field as well. Thus, the quantum dots have gradually entered a stage of industrial production. Compared with traditional phosphors, quantum dot displays have advantages of high luminous efficiency and narrow half peak widths. Thus, quantum dot optical films have high brightness, high color purity and wide color gamut.

Quantum dot optical films have promising application prospects in mobile phones and TV backlights. The preparation of quantum dot optical films requires mixing red quantum dots and green quantum dots with adhesives, and combining with a blue backlight when in use, so as to obtain a white light source. However, since small particle sizes of quantum dots are prone to resonance energy transfer, more green light quantum dots would be needed to achieve white balance. Thus, additional brightness enhancement material needs to be added to increase luminous brightness of quantum dots, thereby reducing an amount of quantum dots.

Barium titanate nanoparticles are conventional scattering particles. The barium source for synthesizing barium titanate nanoparticles in traditional methods is barium hydroxide. The synthesized inorganic barium titanate nanoparticles are hydrophilic, which is not conducive to dispersion in organic solvents and organic acrylic adhesives, thereby affecting brightening effect thereof in quantum dot optical films.

SUMMARY OF INVENTION

Technical Problems

The present application provides barium titanium particles, a method of preparing the same, and a display panel. The barium titanium particles are prepared from barium enoate, which can solve a problem of poor compatibility with organic adhesives, resulting in a poor scattering effect in use of optical films.

Technical Solutions

In order to solve the above problems, in the first aspect, the present disclosure provides a method of preparing barium titanium particles, including the following steps:

a step S01 of mixing a barium source precursor and a titanium source precursor with an alkaline solution, to obtain a to-be-reacted mixture solution, wherein the barium source precursor is selected from barium enoate; and a step S02 of reacting the to-be-reacted mixture solution under a first condition for a first time, and then isolating and purifying to obtain the barium titanium particles.

In the method of preparing the barium titanium particles provided by an embodiment of the present disclosure, a number of carbon atoms in the barium source precursor ranges from 2 to 20.

In the method of preparing the barium titanium particles provided by an embodiment of the present disclosure, the barium source precursor is barium acrylate or barium butenoate.

In the method of preparing the barium titanium particles provided by an embodiment of the present disclosure, the titanium source precursor is selected from titanate compounds.

In the method of preparing the barium titanium particles provided by an embodiment of the present disclosure, the titanium source precursor is tetrabutyl titanate In the method of preparing the barium titanium particles provided by an embodiment of the present disclosure, a molar ratio of Ba in the barium source precursor to Ti in the titanium source precursor is (1-3):2.

In the method of preparing the barium titanium particles provided by an embodiment of the present disclosure, a molar ratio of the Ba to the Ti is 1:1.

In the method of preparing the barium titanium particles provided by an embodiment of the present disclosure, in the step S01, a pH value of the to-be-reacted mixture solution is adjusted to 9-14 by adding the alkaline solution.

In the method of preparing the barium titanium particles provided by an embodiment of the present disclosure, the alkaline solution includes at least one of sodium hydroxide, potassium hydroxide, ammonium hydroxide, ethylenediamine, and hydrazine hydrate.

In the method of preparing the barium titanium particles provided by an embodiment of the present disclosure, in the step S01, the titanium source precursor is first dispersed in an organic solvent, and then mixed with the alkaline solution.

In the method of preparing the barium titanium particles provided by an embodiment of the present disclosure, the organic solvent is selected from at least one of ethanol and toluene.

In the method of preparing the barium titanium particles provided by an embodiment of the present disclosure, in the step S01, the barium source precursor is first dispersed in water, and then mixed with the alkaline solution.

In the method of preparing the barium titanium particles provided by an embodiment of the present disclosure, in the step S02, the first condition includes reacting the to-be-reacted mixture solution in a sealed reactor at 100-2000° C. as a reaction temperature.

In the method of preparing the barium titanium particles provided by an embodiment of the present disclosure, in the step S02, in the step S02, the first time ranges from 2 to 20 hours.

In the second aspect, the present disclosure provides barium titanium particles which is prepared by the aforementioned method of preparing the barium titanium particles.

In the third aspect, the present disclosure provides a display panel, comprising: a color conversion layer, wherein the color conversion layer includes a quantum dot and the aforementioned barium titanium particles.

In the display panel provided by an embodiment of the present disclosure, the quantum dot is selected from at least one of an InP quantum dot, a perovskite quantum dot, a $CuInS_2$ quantum dot, a $Ag_2S$ quantum dot, a PbS quantum dot, a PbSe quantum dot, and a CdSe quantum dot.

In the display panel provided by an embodiment of the present disclosure, the color conversion layer further includes an organic adhesive.

In the display panel provided by an embodiment of the present disclosure, the organic adhesive is selected from acrylic adhesive.

Beneficial Effect

Compared with the prior art, the present disclosure provides barium titanium particles, a method preparing the same, and a display panel. In the method, the barium source of the traditional barium hydroxide is replaced by the organic barium source of barium enoate, so as to obtain a product which is barium titanium particles containing organic groups. Compared with the traditional inorganic barium titanate nanoparticles, due to a better compatibility with an organic adhesive, the barium titanium particles can be better dispersed in a quantum dot optical film, thereby providing a better scattering effect, improving color conversion efficiency of quantum dots, and increasing brightness of the quantum dot optical film.

DESCRIPTION OF DRAWINGS

In order to more clearly illustrate the technical solution in the embodiment of the present disclosure, the drawings necessary in the description of the embodiment will be introduced briefly below. Obviously, the drawings in the following description are only some embodiments of the present disclosure, and for those ordinary skilled in the art, other drawings can be further obtained based on these drawings without creative works.

DETAILED DESCRIPTION OF PREFERRED EMBODIMENTS

The technical solutions of the embodiments of the present disclosure will be clearly and completely described below in conjunction with the drawings in the embodiments of the present disclosure. Obviously, the embodiments described are merely part of the embodiments of the present disclosure, instead of all of the embodiments. Based on the embodiments of the present disclosure, all other embodiments obtained by those of ordinary skill in the art without creative work also fall within the scope of protection of the present disclosure.

The word "exemplary" is used herein to mean "serving as an example, instance, or illustration." Any embodiment described as "exemplary" in the present application is not necessarily to be construed as preferred or advantageous over other embodiments. In order to enable any person skilled in the art to implement and use the present disclosure, the following description is set forth. In the preceding description, details are set forth for purposes of explanation. It should be understood that those of ordinary skill in the art will appreciate that the present disclosure may be implemented without these specific details. In other embodiments, well-known structures and processes will not be described in detail to avoid unnecessary details to obscure the description of the present disclosure. Thus, the present disclosure is not intended to be limited to the embodiments shown herein but is to be accorded the widest scope consistent with the principles and novel features disclosed herein.

Figure 1:
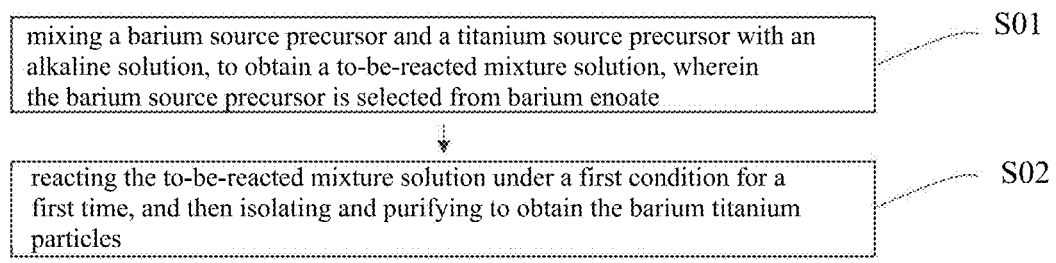
FIG. 1 is a schematic flowchart of a method of preparing barium titanium particles provided by an embodiment of the present disclosure.

An embodiment of the present disclosure provides a method of preparing barium titanium particles. Please refer to the flowchart provided in FIG. 1 for specific steps, which are described respectively in detail below.

The method includes the following steps:

S01: mixing a barium source precursor and a titanium source precursor with an alkaline solution, to obtain a to-be-reacted mixture solution, wherein the barium source precursor is selected from barium enoate.

S02: reacting the to-be-reacted mixture solution under a first condition for a first time, and then isolating and purifying to obtain the barium titanium particles.

In the method provided in the present embodiment, the barium source of the traditional barium hydroxide is replaced by the organic barium source of the barium enoate. Thus, compared with the traditional inorganic barium titanate nanoparticles, the generated product, the barium titanium particles containing organic groups, have better compatibility with an organic adhesive, so that the barium titanium particles can be better dispersed in a quantum dot optical film, thereby providing a better scattering effect, improving light color conversion efficiency of quantum dots, and increasing brightness of the quantum dot optical film.

In some embodiments, a number of carbon atoms in the barium source precursor ranges from 2 to 20. For example, the barium source is barium acrylate or barium butenoate, and the hydrogen atoms in the barium enoate can also be substituted by other common groups.

In some embodiments, the titanium source precursor is selected from titanate compounds. For example, the titanate compound is tetrabutyl titanate.

In some embodiments, a molar ratio of Ba in the barium source precursor to Ti in the titanium source precursor is (1-3):2. Generally, a molar ratio of the Ti to the Ba is 1:1.

In some embodiments, a pH value of the to-be-reacted mixture solution is adjusted to 9-14 by adding the alkaline solution. The alkaline solution includes at least one of sodium hydroxide, potassium hydroxide, ammonium hydroxide, ethylenediamine, and hydrazine hydrate, used as a mineralizer to promote the generation of the barium titanium particles.

In some embodiments, the titanium source precursor is first dispersed in an organic solvent, and, for example, dispersed in a common organic solvent, such as ethanol or toluene, and the barium source precursor is dispersed in water.

In some embodiments, the first condition includes performing calcination in a sealed reactor at 100-2000° C. as the reaction temperature, and the first time ranges from 2 to 20 hours. The higher the reaction temperature is, the less the reaction time is. The lower the reaction temperature is, the more the reaction time is.

Another embodiment of the present disclosure provides barium titanium particles prepared by the method of preparing the barium titanium particles provided by the foregoing embodiment.

Another embodiment of the present disclosure further provides a display panel. The display panel includes a color conversion layer. The color conversion layer includes a quantum dot and the aforementioned barium titanium particles. The color conversion layer is usually made of an organic adhesive as a substrate. According to similar compatible principle, by adding the barium titanium particles containing organic groups used as scattering particles, the barium titanium particles can be uniformly dispersed in the color conversion layer, so as to increase brightness of a color conversion film. That is, an amount of quantum dots can be reduced, and furthermore, absorption of backlight can be increased. The quantum dot can be selected from an InP quantum dot, a perovskite quantum dot, a CuInS2 quantum dot, a Ag2S quantum dot, a PbS quantum dot, a PbSe quantum dot, and a CdSe quantum dot.

A further description with reference to specific embodiments is made in the following:

Example 1

Tetrabutyl titanate (dispersed in ethanol) and barium acrylate monomer (dispersed in water) are mixed with sodium hydroxide solution (1 mol/L) to obtain a to-be-reacted mixture solution, where a molar ratio of Ba to Ti is 1:1. The pH of the to-be-reacted mixture solution is adjusted to 12 by adding the sodium hydroxide solution. After stirring evenly, the to-be-reacted mixture solution is placed in a high pressure reactor at high temperature of 200° C. and high pressure for 10 hours, and the corresponding barium titanium particles powder is obtained after isolation and purification. Green light quantum dots and an acrylic adhesive are mixed in a mass ratio of 1:100, 5.0 wt % of the prepared barium titanium particles powder is added at the same time, and an optical film of 120 microns is formed by coating using a film coating device.

Figure 2:
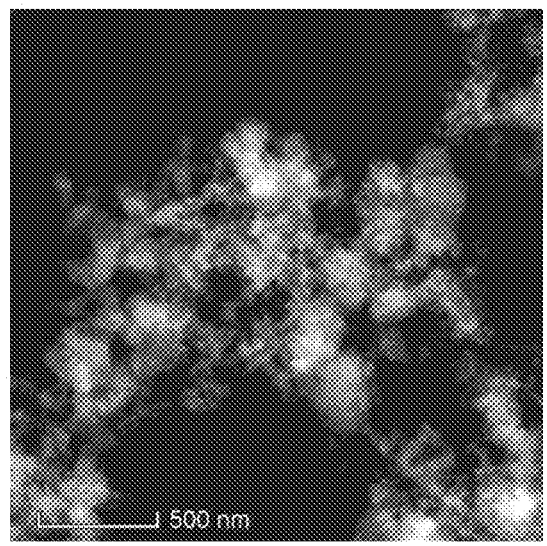
FIG. 2 is a high angle annular dark-field scanning transmission microscope picture of barium titanium particles provided by an embodiment of the present disclosure.

The obtained barium titanium particles powder is tested by a high angle annular dark-field scanning transmission microscope (HADDF-STEM). Please refer to FIG. 2 for the test picture. It can be seen from the test picture that the barium titanium particles have a porous structure which is beneficial to improve light scattering effect, thereby increasing color conversion efficiency and luminous brightness of the quantum dot film.

Figure 4:
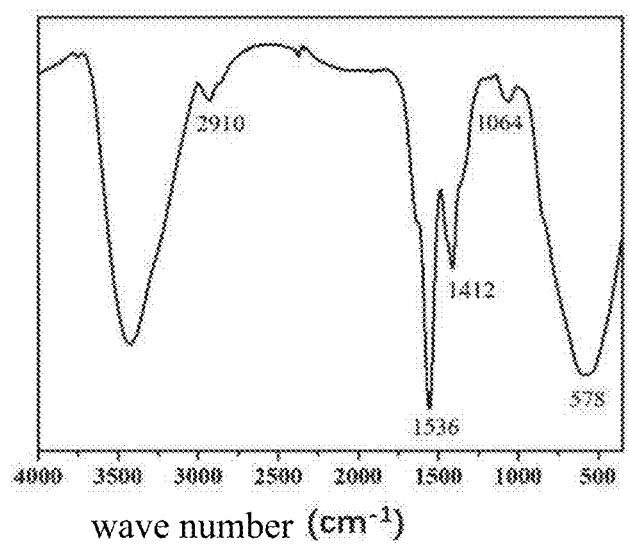
FIG. 4 is a fourier-transform infrared spectroscopy spectrum of barium titanium particles provided by an embodiment of the present disclosure.

The prepared barium titanium particles powder is further tested by fourier-transform infrared spectroscopy. Please refer to FIG. 4 for the test chart. It can be seen from the figure that there is an absorption peak at 2910 cm$^{-1}$, which is the characteristic absorption peak of C—H. This proves that the barium titanium particles powder includes organic groups.

Example 2

Tetrabutyl titanate (dispersed in ethanol) and barium acrylate monomer (dispersed in water) are mixed with sodium hydroxide solution (1 mol/L) to obtain a to-be-reacted mixture solution, where a molar ratio of Ba to Ti is 1:1. The pH of the to-be-reacted mixture solution is adjusted to 12 by adding the sodium hydroxide solution. After stirring evenly, the to-be-reacted mixture solution is placed in a high pressure reactor at high temperature of 200° C. and high pressure for 10 hours, and the corresponding barium titanium particles powder is obtained after isolation and purification. Green light quantum dots and an acrylic adhesive are mixed in a mass ratio of 1:100, 10.0 wt % of the prepared barium titanium particles powder is added at the same time, and an optical film of 120 microns is coated and formed by using a film coating device.

Figure 3:
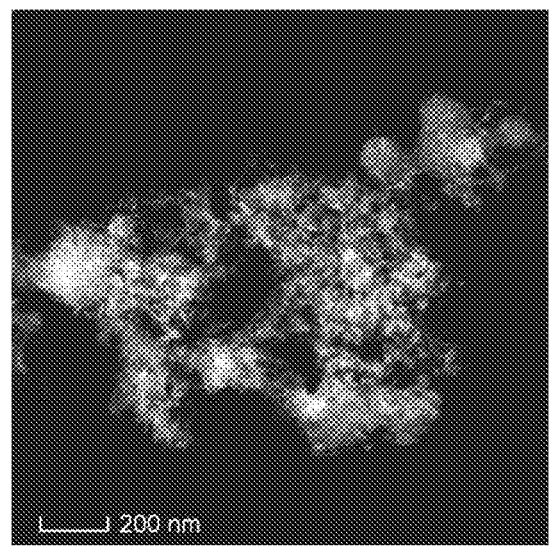
FIG. 3 is a high angle annular dark-field scanning transmission microscope picture of another barium titanium particles provided by an embodiment of the present disclosure.

The obtained barium titanium particles powder is tested by a high angle annular dark-field scanning transmission microscope (HADDF-STEM). Please refer to FIG. 3 for the test picture. It can be seen from the test picture that the barium titanium particles have a porous structure.

Example 3

Tetrabutyl titanate (dispersed in ethanol) and barium butenoate monomer (dispersed in water) are mixed with potassium hydroxide solution (1 mol/L) to obtain a to-be-reacted mixture solution, where a molar ratio of Ba to Ti is 1:1. The pH of the to-be-reacted mixture solution is adjusted to 12 by adding the potassium hydroxide solution. After stirring evenly, the to-be-reacted mixture solution is placed in a high pressure reactor at high temperature of 200° C. and high pressure for 10 hours, and the corresponding barium titanium particles powder is obtained after isolation and purification. Green light quantum dots and an acrylic adhesive are mixed in a mass ratio of 1:100, 5.0 wt % of the prepared barium titanium particles powder is added at the same time, and an optical film of 120 microns is coated and formed by using a film coating device.

Example 4

Tetrabutyl titanate (dispersed in ethanol) and barium butenoate monomer (dispersed in water) are mixed with potassium hydroxide solution (1 mol/L) to obtain a to-be-reacted mixture solution, where a molar ratio of Ba to Ti is 1:1. The pH of the to-be-reacted mixture solution is adjusted to 12 by adding the potassium hydroxide solution. After stirring evenly, the to-be-reacted mixture solution is placed in a high pressure reactor at high temperature of 200° C. and high pressure for 10 hours, and the corresponding barium titanium particles powder is obtained after isolation and purification. Green light quantum dots and an acrylic adhesive are mixed in a mass ratio of 1:100, 10.0 wt % of the prepared barium titanium particles powder is added at the same time, and an optical film of 120 microns is coated and formed by using a film coating device.

Control Group 1

The green light quantum dots and the acrylic adhesive are mixed in a mass ratio of 1:100, and coated to form a 120 μm optical film by using a coating equipment.

Control Group 2

The green light quantum dots and an acrylic adhesive are mixed in a mass ratio of 1:100, 5.0 wt % barium titanate nanoparticles are added at the same time, and coated to form a 120 μm optical film by using a coating equipment.

The optical films prepared in the foregoing examples 1~4 and control groups 1-2 are subjected to a brightness test under 450 nm blue backlight illumination. The results are shown in the following table:

| sample | brightness (cd/m²) |
| --- | --- |
| example 1 | 842.64 |
| example 2 | 890.78 |
| example 3 | 892.81 |
| example 4 | 963.42 |
| control group 1 | 597.30 |
| control group 2 | 832.69 |

It has been verified that the barium titanium particles prepared by the method provided by the present disclosure may be used as scattering particles, effectively improving brightness of the prepared optical film. In addition, compared with traditional inorganic barium titanate nanoparticles prepared with the barium hydroxide used as a barium source, the barium titanium particles of the present disclosure have a higher brightening effect.

Figure 5:
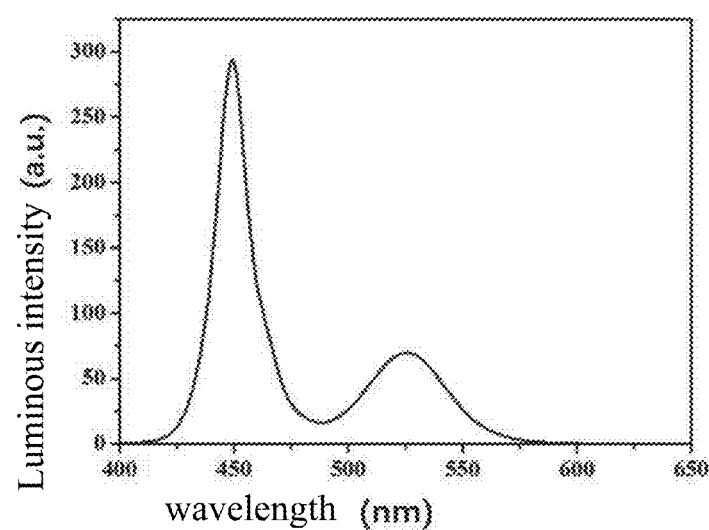
FIG. 5 is a photoluminescence spectrum of an optical film prepared from barium titanium particles provided by an embodiment of the present disclosure.

In addition, please refer to FIG. 5 for the photoluminescence spectrum of the optical film prepared by example 1 for a brightness test. It can be seen from the figure that there is a peak at about 450 nm and about 530 nm, respectively, each of which are respectively formed by the luminescence of blue backlight and green quantum dots.

In the above-mentioned embodiments, each embodiment emphasizes certain aspects, and thus any parts not explained in detail in some embodiments may refer to the foregoing detailed description in the other embodiments above, which are not repeated here.

Barium titanium particles, a method of preparing the same, and a display panel provided by the embodiments of the present disclosure are described in detail above, and specific examples are used herein to illustrate the principle and implementation of the present disclosure. The above embodiments are used only to help understand the methods and core ideas thereof of the present disclosure; meanwhile, those skilled in the art may make changes in terms of embodiments and the scope of application based on the ideas of the present disclosure. As mentioned above, the content of the description shall not be construed as a limitation to the present disclosure.

What is claimed is:

1. A method of preparing barium titanium particles, comprising:
    a step S01 of mixing a barium source precursor and a titanium source precursor with an alkaline solution, to obtain a to-be-reacted mixture solution, wherein the barium source precursor is selected from barium enoate; and
    a step S02 of reacting the to-be-reacted mixture solution under a first condition for a first time, and then isolating and purifying to obtain the barium titanium particles.

2. The method of preparing the barium titanium particles of claim 1, wherein a number of carbon atoms in the barium source precursor ranges from 2 to 20.

3. The method of preparing the barium titanium particles of claim 2, wherein the barium source precursor is barium acrylate or barium butenoate.

4. The method of preparing the barium titanium particles of claim 1, wherein the titanium source precursor is selected from titanate compounds.

5. The method of preparing the barium titanium particles of claim 4, wherein the titanium source precursor is tetra-butyl titanate.

6. The method of preparing the barium titanium particles of claim 1, wherein a molar ratio of Ba in the barium source precursor to Ti in the titanium source precursor is (1-3):2.

7. The method of preparing the barium titanium particles of claim 6, wherein a molar ratio of the Ba to the Ti is 1:1.

8. The method of preparing the barium titanium particles of claim 1, wherein in the step S01, a pH value of the to-be-reacted mixture solution is adjusted to 9-14 by adding the alkaline solution.

9. The method of preparing the barium titanium particles of claim 8, wherein the alkaline solution includes at least one of sodium hydroxide, potassium hydroxide, ammonium hydroxide, ethylenediamine, and hydrazine hydrate.

10. The method of preparing the barium titanium particles of claim 1, wherein in the step S01, the titanium source precursor is first dispersed in an organic solvent, and then mixed with the alkaline solution.

11. The method of preparing the barium titanium particles of claim 10, wherein the organic solvent is selected from at least one of ethanol and toluene.

12. The method of preparing the barium titanium particles of claim 1, wherein in the step S01, the barium source precursor is first dispersed in water, and then mixed with the alkaline solution.

13. The method of preparing the barium titanium particles of claim 1, wherein in the step S02, the first condition includes reacting the to-be-reacted mixture solution in a sealed reactor at 100-2000° C. as a reaction temperature.

14. The method of preparing the barium titanium particles of claim 1, wherein in the step S02, the first time ranges from 2 to 20 hours.

* * * * *